United States Patent
Wakazono et al.

(10) Patent No.: US 12,470,211 B2
(45) Date of Patent: Nov. 11, 2025

(54) CURRENT CONTROL DEVICE, SWITCH CONTROL DEVICE, CURRENT CONTROL METHOD, AND COMPUTER PROGRAM

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Keisuke Wakazono, Yokkaichi (JP); Yuuki Sugisawa, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 267 days.

(21) Appl. No.: 17/906,824

(22) PCT Filed: Mar. 4, 2021

(86) PCT No.: PCT/JP2021/008502
§ 371 (c)(1),
(2) Date: Sep. 20, 2022

(87) PCT Pub. No.: WO2021/192898
PCT Pub. Date: Sep. 30, 2021

(65) Prior Publication Data
US 2023/0370055 A1    Nov. 16, 2023

(30) Foreign Application Priority Data
Mar. 23, 2020  (JP) ................................ 2020-051503

(51) Int. Cl.
*H03K 17/082*    (2006.01)
*G05F 1/56*    (2006.01)
(Continued)

(52) U.S. Cl.
CPC .......... *H03K 17/0822* (2013.01); *G05F 1/56* (2013.01); *H02H 3/087* (2013.01); *H03K 17/145* (2013.01)

(58) Field of Classification Search
CPC ............. H03K 17/0822; H03K 17/145; H03K 2217/0063; G05F 1/56; H02H 3/087; H02H 7/1225
See application file for complete search history.

(56) References Cited

U.S. PATENT DOCUMENTS

| 8,836,313 B2* | 9/2014 | Takagi | G05F 1/561 323/314 |
| 2017/0188420 A1* | 6/2017 | Kido | H05B 47/24 |
| 2019/0267795 A1* | 8/2019 | Oda | H02H 7/12 |

FOREIGN PATENT DOCUMENTS

JP    2006-164089 A    6/2006

OTHER PUBLICATIONS

International Search Report, Application No. PCT/JP2021/008502, mailed Apr. 27, 2021. ISA/Japan Patent Office.

* cited by examiner

*Primary Examiner* — Metasebia T Retebo
(74) *Attorney, Agent, or Firm* — Honigman LLP

(57) ABSTRACT

A current control device includes a constant current circuit and a current adjustment device. The current adjustment device applies a voltage to the constant current circuit. The constant current circuit draws a constant current according to the applied voltage. The micon sets a value of the constant current drawn by the constant current circuit, adjusts the voltage applied to the constant current circuit by the current adjustment device to a voltage according to the set value that is set. The micon adjusts the voltage being applied by the current adjustment device to the constant current circuit (Continued)

based on the difference value between the constant current drawn by the constant current circuit and the set value.

8 Claims, 9 Drawing Sheets

(51) Int. Cl.
*H02H 3/087* (2006.01)
*H03K 17/14* (2006.01)

$$Ith = \frac{Rc \cdot Ic}{Ron}$$

Ith : Current threshold
Rc : Resistance value of device resistor
Ic : Constant current
Ron : ON resistance value Reference value: ON resistance value when the ambient temperature is a predetermined temperature

CURRENT CONTROL DEVICE, SWITCH CONTROL DEVICE, CURRENT CONTROL METHOD, AND COMPUTER PROGRAM

CROSS-REFERENCE TO RELATED APPLICATIONS

This application is the U.S. national stage of PCT/JP2021/008502 filed on Mar. 4, 2021, which claims priority of Japanese Patent Application No. JP 2020-051503 filed on Mar. 23, 2020, the contents of which are incorporated herein.

TECHNICAL FIELD

The present disclosure relates to current control devices, switch control devices, current control methods, and computer programs.

BACKGROUND

JP 2017-229138A discloses a switch control device for vehicles to control the supply of power from a battery to a load. In this switch control device, a semiconductor switch is located in a current path for current to flow from the battery to the load. The power supply to the load is controlled by switching the semiconductor switch ON or OFF. One end of a resistor is connected to the upstream of the semiconductor switch. The switch control device described in JP 2017-229138A includes a constant current circuit, and the constant current circuit draws a constant current from the battery via the resistor.

When the semiconductor switch is ON, the voltage at the downstream end of the semiconductor switch is compared with the voltage at the other end of the resistor. This allows determining whether the current flowing through the semiconductor switch is greater than or equal to the current threshold. The current threshold is expressed as (value of resistance of the resistor)·(constant current)/(ON resistance value of the semiconductor switch). The symbol "·" denotes multiplication. The ON resistance value is the value of resistance of the semiconductor switch when the semiconductor switch is ON.

The current threshold is preferably constant. However, the ON resistance value of a semiconductor switch changes according to the temperature of the semiconductor switch. Therefore, in the switch control device described in JP 2017-229138A, the constant current is changed according to the ambient temperature of the semiconductor switch, which changes in the same manner as the temperature of the semiconductor switch. As a result, a configuration with a small range of change of the current threshold according to the temperature of the semiconductor switch is provided.

As described in JP 2017-229138A, in which the switch control device that compares the voltage at the downstream end of the semiconductor switch is compared with the voltage at the other end of the resistor, for example, a processing unit with a CPU (Central Processing Unit) may set the value of the constant current according to the ambient temperature of the semiconductor switch. In this case, the constant current drawn by the constant current circuit is adjusted based on the set value set by the processing unit.

Here, if the adjusted constant current is different from the set value, the semiconductor switch may not switch from ON to OFF at appropriate timing because the current threshold is not adjusted to a preset target value.

Therefore, one object is to provide a current control device, a switch control device, a current control method, and a computer program that can match the constant current drawn by a constant current circuit with a set value set by a processing unit.

SUMMARY OF DISCLOSURE

A current control device according to one aspect of the present disclosure comprises a constant current circuit to which a voltage is being applied, the constant current circuit drawing a constant current according to the voltage being applied, and a processing unit for performing processing, wherein the processing unit sets a value of the constant current drawn by the constant current circuit, adjusts the voltage being applied to the constant current circuit to a voltage according to the set value that is set, obtains current information indicating the constant current drawn by the constant current circuit, and determines whether or not to adjust the voltage being applied to the constant current circuit based on a difference value between the constant current indicated by the obtained current information and the set value that is set.

A switch control device according to one aspect of the present disclosure comprises a semiconductor switch through which a current flows, a second resistor connected to an upstream end of the semiconductor switch, a switch unit for switching OFF the semiconductor switch when a switch voltage at a downstream end of the semiconductor switch is less than a resistor voltage of a downstream end of the second resistor, a constant current circuit to which a voltage is being applied, the constant current circuit drawing a constant current according to the voltage being applied through the second resistor, and a processing unit for performing processing, wherein the processing unit sets a value of the constant current drawn by the constant current circuit, adjusts the voltage being applied to the constant current circuit to a voltage according to the set value that is set, obtains current information indicating the constant current drawn by the constant current circuit, and determines whether or not to adjust the voltage being applied to the constant current circuit based on a difference value between the constant current indicated by the obtained current information and the set value that is set.

In a current control method according to one aspect of the present disclosure, a computer performs the steps of setting a value of a constant current of a constant current circuit to which a voltage is applied, the constant current circuit drawing the constant current according to the applied voltage, adjusting the voltage applied to the constant current circuit to a voltage according to the set value that is set, obtaining current information indicating the constant current drawn by the constant current circuit, and determining whether or not to adjust the voltage applied to the constant current circuit based on a difference value between the constant current indicated by the obtained current information and the set value that is set.

A computer program according to one aspect of the present disclosure causes a computer to perform the steps of setting a value of a constant current of a constant current circuit to which a voltage is applied, the constant current circuit drawing the constant current according to the applied voltage, adjusting the voltage applied to the constant current circuit to a voltage according to the set value that is set, obtaining current information indicating the constant current drawn by the constant current circuit, and determining whether or not to adjust the voltage applied to the constant current circuit based on a difference value between the constant current indicated by the obtained current information and the set value that is set.

Note that the present disclosure may be implemented not only as a current control device with the foregoing characteristic processing unit, but also as a current control method including the foregoing characteristic processes as steps or as a computer program for causing a computer to perform these steps. Moreover, the present disclosure may be implemented as a semiconductor integrated circuit that implements part of or the entire current control device or as a current control system that includes the current control device.

ADVANTAGEOUS EFFECTS OF DISCLOSURE

According to the present disclosure, the constant current drawn by the constant current circuit can be matched with the set value set by the processing unit.

DETAILED DESCRIPTION OF PREFERRED EMBODIMENTS

Figure 1:
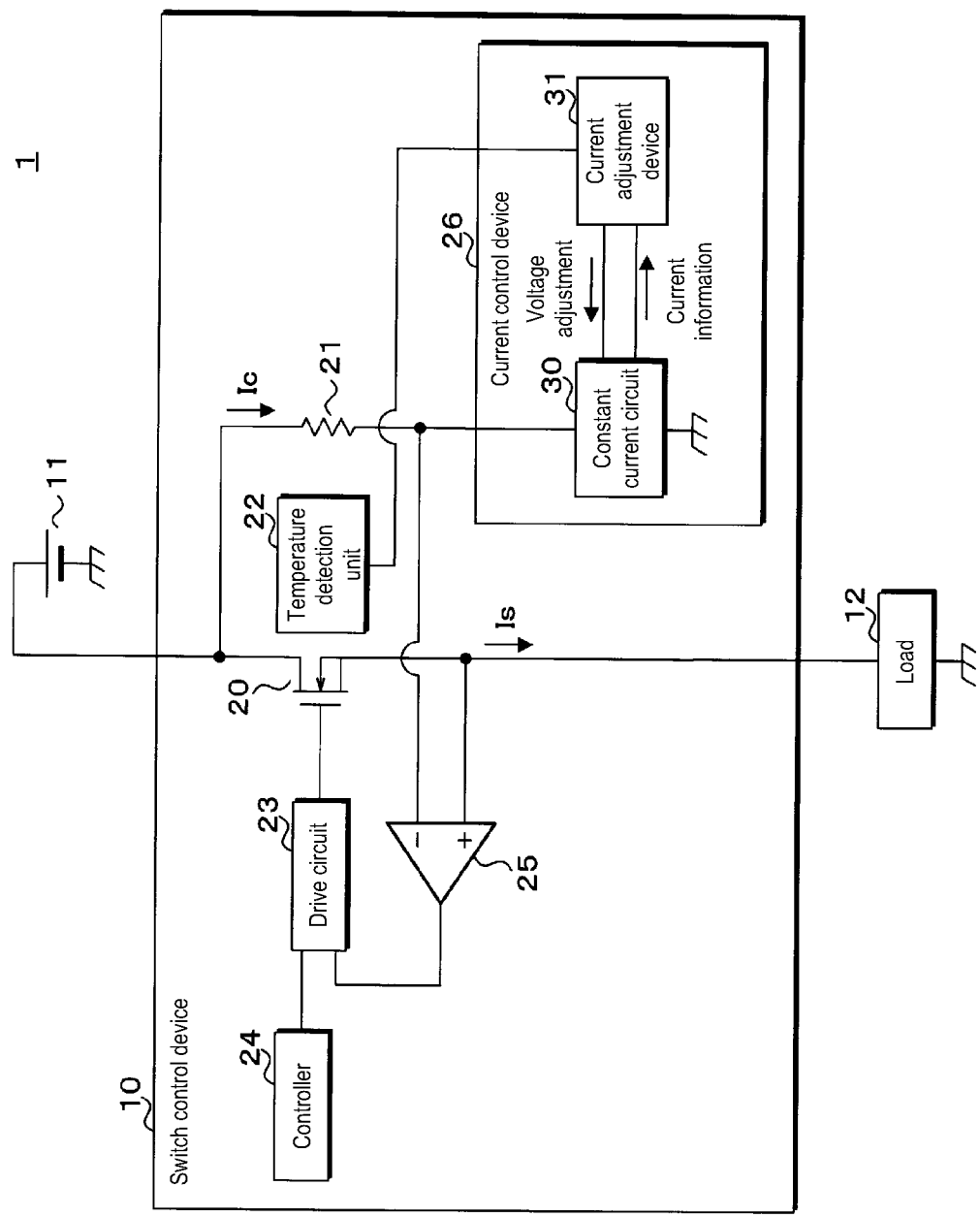
FIG. 1 is a block diagram illustrating the configuration of the main parts of a power supply system in an Embodiment 1.

First, embodiments of the present disclosure will be listed and described. At least portions of the embodiments described below may be combined as desired.

First Aspect

A current control device according to a first aspect of the present disclosure comprises a constant current circuit to which a voltage is being applied, the constant current circuit drawing a constant current according to the voltage being applied, and a processing unit for performing processing, wherein the processing unit sets a value of the constant current drawn by the constant current circuit, adjusts the voltage being applied to the constant current circuit to a voltage according to the set value that is set, obtains current information indicating the constant current drawn by the constant current circuit, and determines whether or not to adjust the voltage being applied to the constant current circuit based on a difference value between the constant current indicated by the obtained current information and the set value that is set.

Second Aspect

In the current control device according to a second aspect of the present disclosure, the constant current circuit comprises an NPN bipolar transistor whose collector is located upstream of its emitter in a current path of the constant current, and a resistor located downstream of the bipolar transistor in the current path, wherein the processing unit adjusts a voltage of a base of the bipolar transistor of the constant current circuit to the voltage according to the set value that is set.

Third Aspect

In the current control device according to a third aspect of the present disclosure, the current information is a voltage between two ends of the resistor.

Fourth Aspect

The current control device according to a fourth aspect of the present disclosure comprises a signal output unit for outputting a PWM signal, and a smoothing circuit for smoothing a voltage of the PWM signal output by the signal output unit, wherein the voltage smoothed by the smoothing circuit is applied to the base of the bipolar transistor, and wherein the processing unit adjusts a duty ratio of the PWM signal according to the set value that is set.

Fifth Aspect

A current control device according to a fifth aspect of the present disclosure comprises a semiconductor switch through which a current flows, a second resistor connected to an upstream end of the semiconductor switch, a switch unit for switching OFF the semiconductor switch when a switch voltage at a downstream end of the semiconductor switch is less than a resistor voltage of a downstream end of the second resistor, a constant current circuit to which a voltage is being applied, the constant current circuit drawing, through the second resistor, a constant current according to the voltage being applied, and a processing unit for performing processing, wherein the processing unit sets a value of the constant current drawn by the constant current circuit, adjusts the voltage being applied to the constant current circuit to a voltage according to the set value that is set, obtains current information indicating the constant current drawn by the constant current circuit, and determines whether or not to adjust the voltage being applied to the constant current circuit based on a difference value between the constant current indicated by the obtained current information and the set value that is set.

Sixth Aspect

The switch control device according to a sixth aspect of the present disclosure comprises a temperature detection unit for detecting an ambient temperature of the semiconductor switch, wherein the processing unit sets the set value of the constant current drawn by the constant current circuit according to the ambient temperature detected by the temperature detection unit.

Seventh Aspect

In a current control method according to a seventh aspect of the present disclosure, a computer performs the steps of setting a value of a constant current of a constant current circuit to which a voltage is applied, the constant current circuit drawing the constant current according to the applied voltage, adjusting the voltage applied to the constant current circuit to a voltage according to the set value that is set, obtaining current information indicating the constant current drawn by the constant current circuit, and determining whether or not to adjust the voltage applied to the constant current circuit based on a difference value between the constant current indicated by the obtained current information and the set value that is set.

Eighth Aspect

A computer program according to an eighth aspect of the present disclosure causes a computer to perform the steps of setting a value of a constant current of a constant current circuit to which a voltage is applied, the constant current circuit drawing the constant current according to the applied voltage, adjusting the voltage applied to the constant current circuit to a voltage according to the set value that is set, obtaining current information indicating the constant current drawn by the constant current circuit, and determining whether or not to adjust the voltage applied to the constant current circuit based on a difference value between the constant current indicated by the obtained current information and the set value that is set.

In the current control device, the current control method, and the computer program of the foregoing aspects, for example, if the constant current drawn by the constant current circuit is different from the set value, the constant current is fine adjusted by adjusting the voltage applied to the constant current circuit. Therefore, the constant current drawn by the constant current circuit can be matched with the set value set by the processing unit. "Match" as used herein is not limited to its strict meaning. The constant current may be considered to match the set value if the difference value between the constant current and the set value is less than a certain value. This certain value is, for example, a value that can be regarded as an error.

In the current control device of the eighth aspect, the value of resistance between the collector and the emitter of the bipolar transistor is adjusted so that the current flowing through the collector and the emitter is determined by the voltage at the base of the bipolar transistor, and a constant current flows. The higher the voltage at the base, the higher the constant current.

In the current control device of the eighth aspect, the voltage between the two ends of the resistor is proportional to the constant current drawn by the constant current circuit. The constant current is calculated based on the voltage between the two ends of the resistor.

In the current control device of the eighth aspect, the voltage at the base of the bipolar transistor is adjusted by adjusting the duty ratio of the PWM signal. The higher the duty ratio, the higher the voltage at the base.

In the switch control device of the eighth aspect, the switch voltage being less than the resistor voltage means that the current flowing through the semiconductor switch exceeds the current threshold expressed as (value of resistance of the second resistor)·(constant current)/(ON resistance value of the semiconductor switch). The symbol "·" denotes multiplication. If the current flowing through the semiconductor switch exceeds the current threshold, the semiconductor switch is switched OFF. As such, an overcurrent that greatly exceeds the current threshold is prevented from flowing through the semiconductor switch.

In the current control device of the eighth aspect, the ON resistance of the semiconductor switch is subject to change according to the temperature of the semiconductor switch, i.e., the ambient temperature of the semiconductor switch. The set value of the constant current is set according to the ambient temperature of the semiconductor switch. In this way, the current threshold, expressed as (value of resistance of the second resistor)·(constant current)/(ON resistance value of the semiconductor switch), can be maintained at a certain value independent of the ambient temperature of the semiconductor switch.

Specific examples of power supply systems of the present disclosure will be described hereinafter with reference to the drawings. The present disclosure is not limited by these examples but indicated by the claims, and all changes that come within the claims and the meaning and range of equivalency of the claims are intended to be encompassed within the scope of the disclosure.

Embodiment 1

Configuration of Power Supply System

FIG. 1 is a block diagram illustrating the configuration of the main parts of a power supply system 1 in an Embodiment 1. The power supply system 1 may be installed onboard a vehicle and includes a switch control device 10, a battery 11, and a load 12. The switch control device 10 includes a semiconductor switch 20. The semiconductor switch 20 is an N-channel MOSFET (Metal Oxide Semiconductor Field Effect Transistor). The drain of the semiconductor switch 20 is connected to the positive pole of the battery 11. The source of the semiconductor switch 20 is connected to one end of the load 12. The negative pole of the battery 11 and the other end of the load 12 are grounded.

When the semiconductor switch 20 is ON, current flows from the positive pole of battery 11 to the load 12 through the drain and the source of the semiconductor switch 20. The battery 11 supplies power to the load 12 through the semiconductor switch 20. When the semiconductor switch 20 is OFF, no current flows through the drain and the source of the semiconductor switch 20. Therefore, no power is supplied to the load 12. The load 12 is an electrical apparatus installed onboard the vehicle. The load 12 operates while the current is supplied to the load 12. The load 12 stops operating when the supply of current to the load 12 is stopped. The switch control device 10 controls the power supply from the battery 11 to the load 12 by switching the semiconductor switch 20 ON or OFF.

When the semiconductor switch 20 is ON, current flows to the drain and to the source of the semiconductor switch 20 in that order. Therefore, the drain of the semiconductor switch 20 is the upstream end of the semiconductor switch 20. The source of the semiconductor switch 20 is the downstream end of the semiconductor switch 20.

Configuration of Switch Control Device 10

In addition to the semiconductor switch 20, the switch control device 10 includes a device resistor 21, a temperature detection unit 22, a drive circuit 23, a controller 24, a comparator 25, and a current control device 26. The comparator 25 includes a positive terminal, a negative terminal, and an output terminal. The current control device 26 includes a constant current circuit 30 and a current adjustment device 31.

The drain of the semiconductor switch 20 is connected to one end of the device resistor 21. The device resistor 21 functions as a second resistor. The other end of the device resistor 21 is connected to the constant current circuit 30. The constant current circuit 30 is grounded. Within the current control device 26, the constant current circuit 30 is connected to the current adjustment device 31. The current adjustment device 31 is further connected to the temperature detection unit 22. The gate of the semiconductor switch 20 is connected to the drive circuit 23. Furthermore, the drive circuit 23 is connected separately to the controller 24 and the output terminal of the comparator 25. The positive terminal of the comparator 25 is connected to the source of the semiconductor switch 20. The negative terminal of the comparator 25 is connected to the other end of the device resistor 21.

The semiconductor switch 20 is ON if the voltage of the gate of the semiconductor switch 20, with respect to the potential of the source, is higher than or equal to a certain voltage value. The semiconductor switch 20 is OFF if the voltage of the gate of the semiconductor switch 20, with respect to the potential of the source, is lower than the certain voltage value.

The controller 24 and the comparator 25 each output a high level voltage or a low level voltage to drive circuit 23. The drive circuit 23 switches ON or OFF the semiconductor switch 20 according to the output voltage of the controller 24 and the comparator 25. To switch ON the semiconductor switch 20, the drive circuit 23 increases the voltage of the gate, with respect to a ground potential. In this way, the voltage of the gate, with respect to the potential of the source, increases to or above the certain voltage. As a result, the semiconductor switch 20 is switched ON. To switch OFF the semiconductor switch 20, the drive circuit 23 reduces the voltage of the gate, with respect to the ground potential. In this way, the voltage of the gate, with respect to the potential of the source, decreases to or below the certain voltage. As a result, the semiconductor switch 20 is switched OFF.

The voltage at the source of the semiconductor switch 20 is hereinafter referred to as the "switch voltage". The voltage at the end of the device resistor 21 on the side of the constant current circuit 30 is referred to as the "resistor voltage". The reference potential of the switch voltage and the resistor voltage is the ground potential. The comparator 25 outputs a high level voltage to the drive circuit 23 when the switch voltage is greater than or equal to the resistor voltage. The comparator 25 outputs a low level voltage to the drive circuit 23 when the switch voltage is lower than the resistor voltage.

The constant current circuit 30 of the current control device 26 draws a constant current from the positive pole of the battery 11 through the device resistor 21. The constant current drawn into the constant current circuit 30 returns to the negative pole of the battery 11. The current adjustment device 31 applies a voltage to the constant current circuit 30.

The constant current circuit 30 draws a constant current according to the voltage applied by the current adjustment device 31. The constant current circuit 30 outputs current information to the current adjustment device 31 that indicates the constant current drawn by the constant current circuit 30.

The temperature detection unit 22 detects the ambient temperature of the semiconductor switch 20 and outputs temperature information indicating the detected ambient temperature to the current adjustment device 31. The current adjustment device 31 adjusts the voltage applied to the constant current circuit 30 based on the input temperature information and current information. The constant current drawn by the constant current circuit 30 is adjusted by adjusting the voltage applied to the constant current circuit 30.

The output voltage of battery 11 is denoted as Vd. The switch current flowing through the semiconductor switch 20 is denoted as Is. The constant current drawn by the constant current circuit 30 is denoted as Ic. Is and Ic are numerical values. The ON resistance value of the semiconductor switch 20 is denoted as Ron. The ON resistance value is the value of resistance between the drain and the source of the semiconductor switch 20 when the semiconductor switch is ON. The value of resistance of the device resistor 21 is denoted as Rc. In this case, the switch voltage is expressed as (Vd−Ron·Is). The resistor voltage is expressed as (Vd−Rc·Ic). Vd, Is, Ic, Ron, and Rc are positive values.

Assume that the semiconductor switch 20 is ON. As described above, if the switch voltage is higher than or equal to the value of resistance, i.e., if the following equation is satisfied, the comparator 25 outputs a high level voltage:

$$Vd-Ron \cdot Is \geq Vd-Rc \cdot Ic$$

Expanding this inequality yields the following equation:

$$Is \leq Rc \cdot Ic/Ron$$

The current threshold expressed as Rc·Ic/Ron is denoted as Ith. As the expanded inequality indicates, the switch voltage being higher than or equal to the resistor voltage means that the switch current Is is lower than or equal to the current threshold Ith. As the value of resistance Rc of the device resistor 21, the constant current Ic, and the ON resistance value Ron are positive values, the current threshold Ith is also a positive value.

As described above, if the switch voltage is less than the resistor voltage, i.e., if the following equation is satisfied, the comparator 25 outputs the low level voltage:

$$Vd-Ron \cdot Is < Vd-Rc \cdot Ic$$

Expanding this inequality yields the following equation:

$$Is > Rc \cdot Ic/Ron (=Ith)$$

The switch voltage being less than the resistor voltage means that the switch current Is is above the current threshold Ith.

Therefore, if the switch current Is is less than or equal to the current threshold Ith, the comparator 25 outputs the high level voltage to the drive circuit 23. If the switch current Is is above the current threshold Ith, the comparator 25 outputs the low level voltage to the drive circuit 23.

When the semiconductor switch 20 is OFF, the switch voltage is 0V. The resistor voltage is expressed as Vd−Rc·Ic. This value is a positive value. Therefore, when the semiconductor switch 20 is OFF, the switch voltage is less than the resistor voltage, so that the comparator 25 outputs the low level voltage.

Operation of Semiconductor Switch 20

Figure 2:
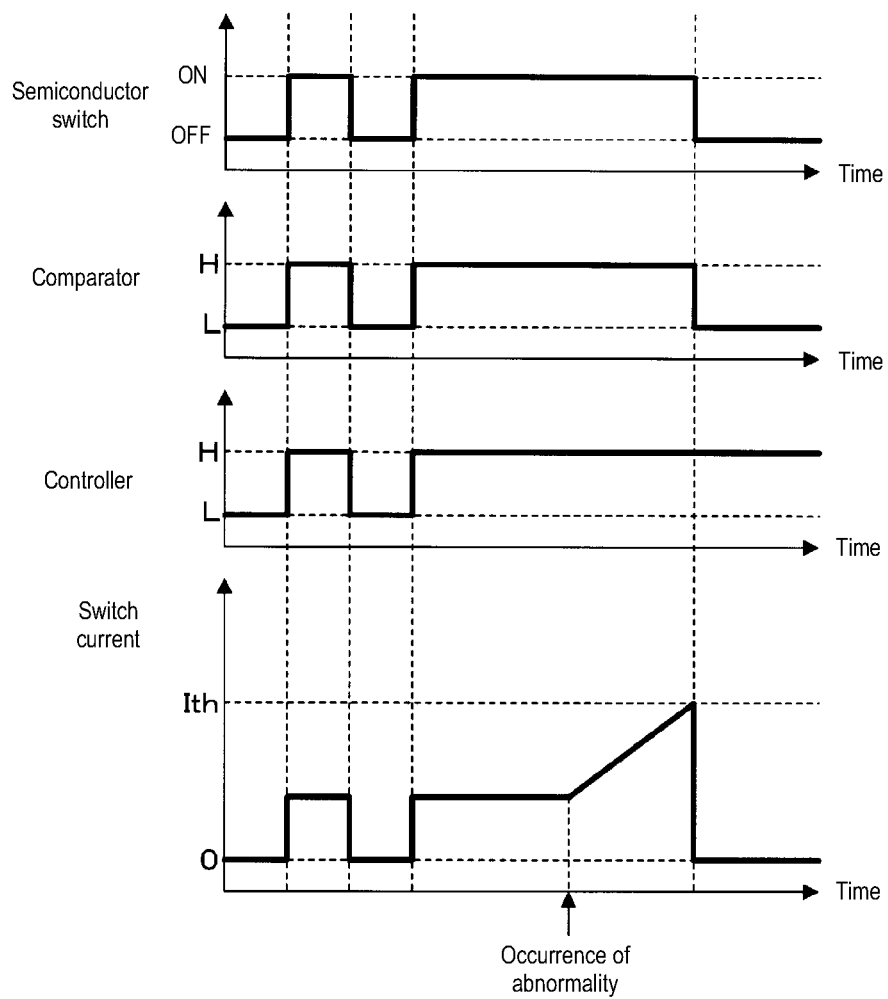
FIG. 2 is a timing chart illustrating the operation of a semiconductor switch.

FIG. 2 is a timing chart to illustrate the operation of the semiconductor switch 20. FIG. 2 shows a graph of the state of the semiconductor switch 20, graphs of the output voltages of the comparator 25 and the controller 24, and a graph of the switch current. The horizontal axes of these graphs denote the time. In FIG. 2, the high and low level voltages are denoted as "H" and "L", respectively.

When the controller 24 outputs the low level voltage to the drive circuit 23, the drive circuit 23 keeps the semiconductor switch 20 OFF. When the semiconductor switch 20 is OFF, the switch current is 0 A, and the comparator 25 outputs the low level voltage to the drive circuit 23.

When the controller 24 switches the output voltage from the low level voltage to the high level voltage, the drive circuit 23 switches the semiconductor switch 20 from OFF to ON. As such, a current flows from the positive pole of the battery 11 to the load 12 through the semiconductor switch 20. If the power supply system 1 is normal, the switch current is less than or equal to the current threshold Ith when the semiconductor switch 20 is ON. Therefore, the comparator 25 switches the output voltage from the low level voltage to the high level voltage.

When the controller 24 switches the output voltage from the high level voltage to the low level voltage, the drive circuit 23 switches the semiconductor switch 20 from ON to OFF. As such, current stops flowing through the semiconductor switch 20. As a result, the switch current drops to 0 A, and the output voltage of the comparator 25 switches from the high level voltage to the low level voltage.

As described above, when the power supply system 1 is normal, the drive circuit 23 switches ON or OFF the semiconductor switch 20 according to the output voltage of the controller 24. To operate the load 12, the controller 24 outputs the high level voltage to the drive circuit 23. To stop the operation of the load 12, the controller 24 outputs the low level voltage to the drive circuit 23.

As described above, when the controller 24 outputs the high level voltage, the semiconductor switch 20 is ON, and the switch current flows through the semiconductor switch 20. When the power system 1 is normal, the switch current is less than the current threshold Ith, and the comparator 25 outputs the high level voltage Ith.

Assume that when the semiconductor switch 20 is ON, an abnormality occurs in the power supply system 1 and the switch current increases. When the switch current exceeds the current threshold Ith, the comparator 25 switches the output voltage from the high level voltage to the low level voltage. If the output voltage of the comparator 25 switches from the high level voltage to the low level voltage while the output voltage of the controller 24 is the high level voltage, the drive circuit 23 switches OFF the semiconductor switch 20. This reduces the switch current to 0 A. As a result, an overcurrent that greatly exceeds the current threshold Ith is prevented from flowing through the semiconductor switch 20. The drive circuit 23 functions as a switch unit. In the example of FIG. 2, after being switched OFF, the semiconductor switch 20 remains OFF. As described above, when the semiconductor switch 20 is OFF, the output voltage of the comparator 25 is the low level voltage.

Temperature Dependence of ON Resistance Value of Semiconductor Switch 20

Figure 3:
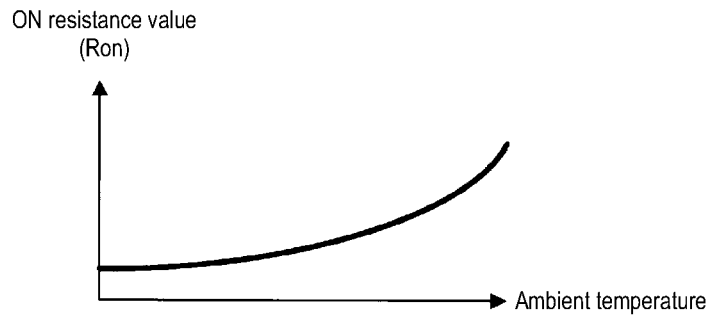
FIG. 3 is a graph showing the relationship between the ON resistance value and the ambient temperature of the semiconductor switch.

FIG. 3 shows the relationship between the ON resistance value Ron and the ambient temperature of the semiconductor switch 20. The ON resistance value Ron of the semiconductor switch 20 changes according to the temperature of the semiconductor switch 20. The ambient temperature of the semiconductor switch 20 changes in the same manner as the temperature of the semiconductor switch 20. Therefore, the ON resistance value Ron of the semiconductor switch 20 changes according to the ambient temperature of the semiconductor switch 20. As shown in FIG. 3, the ON resistance value Ron increases when the ambient temperature of the semiconductor switch 20 increases.

Therefore, if the ambient temperature of the semiconductor switch 20 is high when the value of resistance Rc of the device resistor 21 and the constant current Ic are fixed, the current threshold Ith is small because the ON resistance value Ron is large. Therefore, when the ambient temperature of the semiconductor switch 20 is high, even though the switch current is a normal current, the drive circuit 23 may erroneously switch OFF the semiconductor switch 20.

Therefore, in the switch control device 10, the current adjustment device 31 adjusts the constant current Ic drawn by the constant current circuit 30 according to the ambient temperature of the semiconductor switch 20 detected by the temperature detection unit in the same manner as the ON resistance value Ron. Specifically, if the ON resistance value Ron increases 1.2 times due to the change in the ambient temperature of the semiconductor switch 20, the current adjustment device 31 adjusts the constant current Ic to 1.2 times the value. In this way, the current threshold Ith can be maintained at a constant target value independent of the ambient temperature of the semiconductor switch 20.

The value of resistance Rc of the device resistor 21 is constant irrespective of the ambient temperature of the semiconductor switch 20.

The current adjustment device 31 sets the value of the constant current Ic in accordance with the ambient temperature of the semiconductor switch 20 indicated by the temperature information input from the temperature detection unit 22, and adjusts the voltage applied to the constant current circuit 30 to the voltage corresponding to the set value. In this way, the constant current circuit 30 adjusts the constant current. If the constant current indicated by the current information input from the constant current circuit 30 is different from the set value, the current adjustment device 31 fine adjusts the constant current by adjusting the voltage applied to the constant current circuit 30.

Configuration of Constant Current Circuit 30

Figure 4:
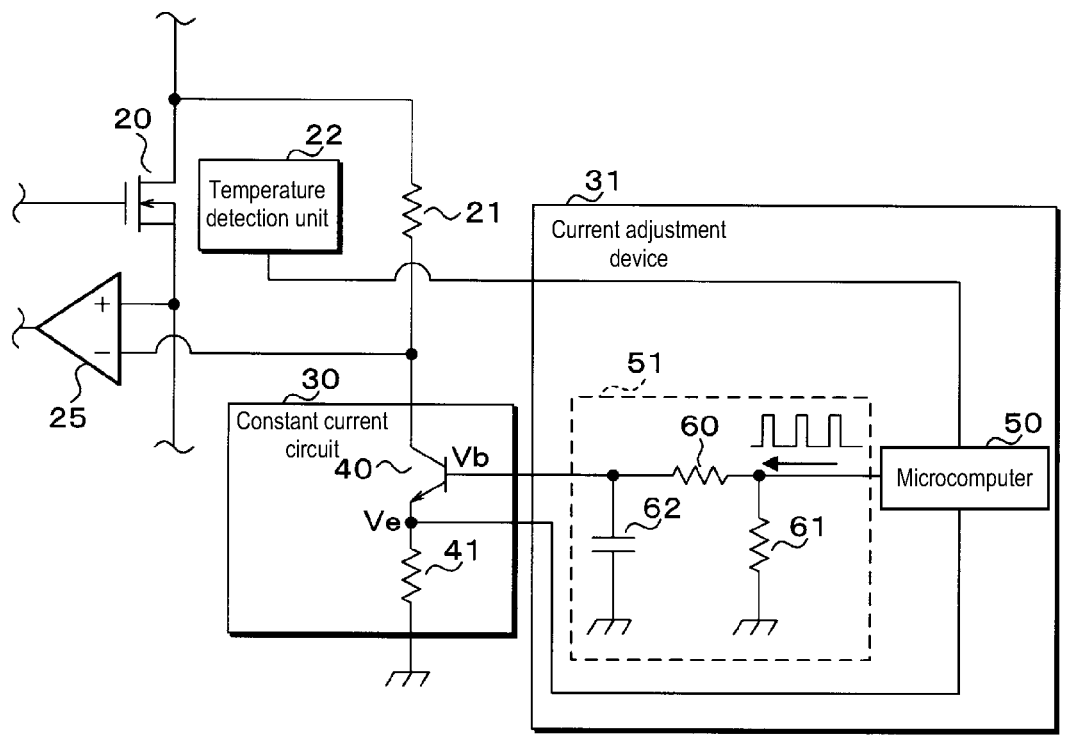
FIG. 4 is a circuit diagram showing the configuration of the main parts of a constant current circuit and a current adjustment device.

FIG. 4 is a circuit diagram showing the configuration of the main parts of the constant current circuit 30 and the current adjustment device 31. The constant current circuit 30 includes a transistor 40 and a circuit resistor 41. The transistor 40 is an NPN bipolar transistor. The collector of the transistor 40 is connected to the other end of the device resistor 21. The emitter of the transistor 40 is connected to the current adjustment device 31 and one end of the circuit resistor 41. The other end of circuit resistor 41 is grounded. The base of the transistor 40 is connected to current adjustment device 31.

A constant current flows through the device resistor 21, the collector of the transistor 40, the emitter of the transistor 40, and the circuit resistor 41, in that order. Therefore, in the current path of the constant current, the collector of the transistor 40 is located upstream of the emitter of the transistor 40. In the constant current path, the circuit resistor 41 is located downstream of the transistor 40.

The current adjustment device 31 applies a voltage to the base of the transistor 40, with respect to the ground potential. The voltage at the base of the transistor 40, with respect to the ground potential, will be hereinafter denoted as Vb. The voltage at the emitter of the transistor 40, with respect to the ground potential, is denoted as Ve. The voltage between the emitter and the base of the transistor 40, with respect to the ground potential, is denoted as Vbe. The voltage Vbe is substantially constant. If the transistor 40 is formed of silicon, the voltage Vbe is about 0.6 V.

The resistance between the collector and the emitter of the transistor 40 is adjusted so that the emitter voltage Ve matches (Vb−Vbe). Specifically, if the base voltage Vb increases, the resistance between the collector and the emitter of the transistor 40 decreases. In this way, the combined resistance of the device resistor 21, the transistor 40, and the circuit resistor 41 decreases, and the current flowing from the positive pole of the battery 1 to the circuit resistor 41 increases. As such, the emitter voltage Ve increases to (Vb−Vbe).

If the base voltage Vb decreases, the resistance between the collector and the emitter of the transistor 40 increases. In this way, the combined resistance of the device resistor 21, the transistor 40, and the circuit resistor 41 increases, and the current flowing from the positive pole of the battery 1 to the circuit resistor 41 increases. As such, the emitter voltage Ve is reduced to (Vb−Vbe).

If the value of resistance of the circuit resistor 41 is denoted as Rk, the current flowing through the circuit resistor 41 is adjusted to (Vb−Vbe)/Rk, and a constant current flows through the collector and the emitter of transistor 40.

Even if the output voltage of the battery 11 changes, the constant current is adjusted to (Vb−Vbe)/Rk. If the output voltage of the battery 11 decreases, the value of resistance between the collector and the emitter of the transistor 40 decreases, and the constant current is maintained at (Vb−Vbe)/Rk. If the output voltage of the battery 11 increases, the value of resistance between the collector and the emitter of the transistor 40 increases, and the constant current is maintained at (Vb−Vbe)/Rk.

The current amplification factor of the transistor 40 expressed as (current flowing into the collector)/(current flowing into the base) is denoted as hfe. Since the current flowing into the collector is the constant current Ic, the current flowing from the current adjustment device 31 to the base of the transistor 40 is expressed as Ic/hfe. Therefore, the current output from the emitter of the transistor 40 to the circuit resistor 41 is expressed as (1+hfe)·Ic/hfe.

As this current is equal to (Vb−Vbe)/Rk, the constant current Ic is expressed by the following equation:

$$Ic=hfe(Vb-Vbe)/((1+hfe)\cdot Rk)$$

The current amplification factor hfe, the voltage Vbe, and the resistance Rk are substantially constant. Therefore, the constant current Ic can be adjusted by adjusting the base voltage Vb. The current adjustment device 31 adjusts the voltage Vb at the base. The higher the voltage Vb at the base, the larger the constant current Ic.

The emitter voltage Ve is expressed by the following equation:

$$Ve=Rk(1+hfe)\cdot Ic/hfe$$

The voltage Ve of the emitter is proportional to the constant current Ic. Since the value of resistance Rk and the current amplification factor hfe are constants, the constant current Ic can be calculated based on the emitter voltage Ve. The voltage of the emitter Ve, i.e., the voltage between the two ends of the circuit resistor 41, is output to the current adjustment device 31 as current information indicating the constant current Ic.

Configuration of Current Adjustment Device 31

As shown in FIG. 4, the current adjustment device 31 includes a microcomputer 50 and a smoothing circuit 51. The smoothing circuit 51 includes a first resistor 60, a second resistor 61, and a capacitor 62. The microcomputer 50 is connected to the temperature detection unit 22 and the emitter of the transistor 40. The microcomputer 50 is further connected to one end of the first resistor 60 and one end of the second resistor 61 of the smoothing circuit 51. The other end of the first resistor 60 is connected to the base of the transistor 40 and one end of the capacitor 62. The other end of each of the first resistor 60 and capacitor 62 is grounded.

The microcomputer 50 outputs to the smoothing circuit 51 a PWM (Pulse Width Modulation) signal comprising a high level voltage and a low level voltage. The voltage of the PWM signal is a voltage with respect to the ground potential. The high level voltage of the PWM signal is a positive constant voltage, for example, 5V. The low level voltage of the PWM signal is a voltage lower than the high level voltage, for example, 0V.

The PWM signal is periodically switched from the low-level voltage to the high-level voltage, or from the high-level voltage to the low-level voltage. The microcomputer 50 adjusts the percentage of time in which the voltage of the PWM signal is the high level voltage in one cycle, i.e., the duty ratio. The duty ratio is a value that is greater than or equal to 0 and less than or equal to 1. The greater the duty ratio, the longer the period during which the voltage is the high level voltage in one cycle.

When the voltage of the PWM signal is a high level voltage, current flows from the microcomputer 50 to the first resistor 60 and to the capacitor, in that order, to charge the capacitor 62. The value of resistance of the first resistor 60 is denoted as R1. The capacitance of the capacitor 62 is denoted as C. The larger a first time constant expressed by R1·C, the slower the charging rate of the capacitor 62. When the voltage of the PWM signal is the low level voltage, current flows from the capacitor 62 to the first resistor 60 and to the second resistor 61, in that order, to discharge the capacitor 62. The value of resistance of the second resistor 61 is denoted as R2. The larger a second time constant expressed by (R1+R2)·C, the slower the discharging rate of capacitor 62.

As described above, the capacitor 62 smooths the voltage of the PWM signal by charging and discharging. The first and second time constants are sufficiently large. Therefore, the voltage between the two ends of the capacitor 62 substantially matches the mean value of the voltage of the PWM signal in one cycle.

The voltage smoothed by the capacitor 62, i.e., the voltage between the two ends of the capacitor 62, is applied to the base of the transistor 40. The voltage Vb at the base of the transistor 40 changes depending on the duty ratio of the PWM signal. The higher the duty ratio of the PWM signal, the higher the voltage Vb at the base of the transistor 40.

The microcomputer 50 adjusts the voltage at the base Vb by adjusting the duty ratio of the PWM signal. Temperature information is output to the microcomputer 50 from the temperature detection unit 22. Current information is output to the microcomputer 50 from the constant current circuit 30. The microcomputer 50 adjusts the duty ratio of the PWM signal, i.e., the voltage at the base Vb, based on the temperature information and the current information.

Current flows into the base of the transistor 40 through the first resistor 60 or from the capacitor 62.

Configuration of Microcomputer 50

Figure 5:
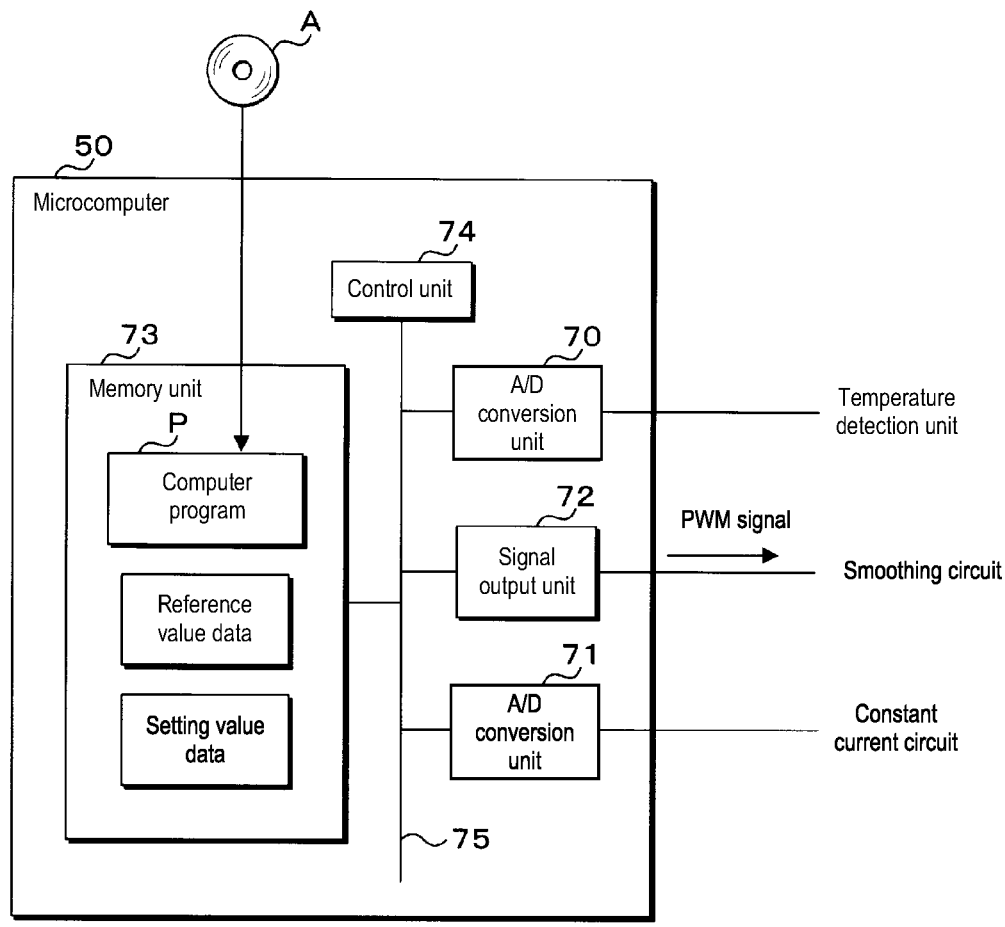
FIG. 5 is a block diagram showing the configuration of the main parts of a micon.

FIG. 5 is a block diagram showing the configuration of the main parts of the microcomputer 50. The microcomputer 50 includes A/D conversion units 70, 71, a signal output unit 72, a memory unit 73, and a control unit 74. These are connected to an internal bus 75. The A/D conversion unit 70 is further connected to the temperature detection unit 22. The A/D conversion unit 71 is further connected to one end of the circuit resistor 41 of the constant current circuit 30. The signal output unit 72 is further connected to one end of the capacitor 62 of the smoothing circuit 51.

Analog temperature information is output from the temperature detection unit 22 to the A/D converter unit 70. The analog temperature information is, for example, a voltage that changes according to the ambient temperature of the semiconductor switch 20. The A/D converter unit 70 converts the input analog temperature information into digital temperature information. The control unit 74 obtains the digital temperature information from the A/D conversion unit 70. The ambient temperature of the semiconductor switch 20 indicated by the temperature information obtained by the control unit 74 substantially matches the ambient temperature of the semiconductor switch 20 at the time of obtaining.

The signal output unit 72 outputs a PWM signal to the smoothing circuit 51. The duty ratio of the PWM signal is adjusted by the control unit 74. The smoothing circuit 51 smooths the voltage of the PWM signal output by the signal output unit 72.

Analog current information is output from the constant current circuit 30 to the A/D conversion unit 71. The analog current information is the voltage of the emitter of the transistor 40 as described above. The A/D conversion unit 71 converts the analog current information into digital current information. The control unit 74 obtains the digital current information from the A/D conversion unit 71. The constant current indicated by the current information obtained by the control unit 74 substantially matches the constant current at the time of obtaining.

The storage unit 73 is a non-volatile memory. A computer program P is stored in the memory unit 73. The control unit 74 has a processing element, for example, a CPU (Central Processing Unit), which performs processing, and functions as a processing unit. The processing element of the control unit 74 performs a current adjustment process and a fine adjustment process by executing the computer program P. The current adjustment process is a process of adjusting the constant current to the set value. The fine adjustment process is a process of fine adjusting the constant current.

Note that the computer program P may be stored on a storage medium A in a manner such that it is readable by the processing element of the control unit 74. In this case, the computer program P read from the storage medium A by an unshown readout device is written to the memory unit 73. The storage medium A is an optical disk, a flexible disk, a magnetic disk, a magneto-optical disk, a semiconductor memory, etc. The optical disk is a CD (Compact Disk)-ROM (Read Only Memory), a DVD (Digital Versatile Disc)-ROM, a BD (Blue-ray® Disc), etc. The magnetic disk is a hard disk, for example. Alternatively, the computer program P may be downloaded from an unshown device connected to a communication network, and the downloaded computer program P may be written to the memory unit 73.

The number of processing elements that the control unit 74 has is not limited to one, but may be two or more. In this case, a plurality of processing elements may cooperate to perform processes such as the current adjustment and the fine adjustment process according to the computer program P.

In addition to the computer program P, reference value data indicating a reference value regarding the ON resistance value of the semiconductor switch 20 is stored in the memory unit 73. The reference value is the ON resistance value of the semiconductor switch 20 when the ambient temperature of the semiconductor switch 20 is a predetermined temperature, for example, 27° C. In switches for use as the semiconductor switch 20, manufacturing errors occur in the reference value of the switch, i.e., the ON resistance value of the switch at the predetermined temperature. Therefore, the manufacturer of the switch control device 10 measures, in advance, the ON resistance value of the switch used as the semiconductor switch 20 of the switch control device 10 at the predetermined temperature, and stores data indicating the measured ON resistance value in the memory unit 73 as the reference value data.

The memory unit 73 further stores set value data indicating the set value of the constant current. The set value indicated by the set value data is updated by the control unit 74. The memory unit 73 further stores a graph indicating the relationship between the rate of change of the ON resistance value and the ambient temperature of the semiconductor switch 20, and a graph indicating the relationship between the set value of the duty ratio and the set value of the constant current of the PWM signal.

Figure 6:
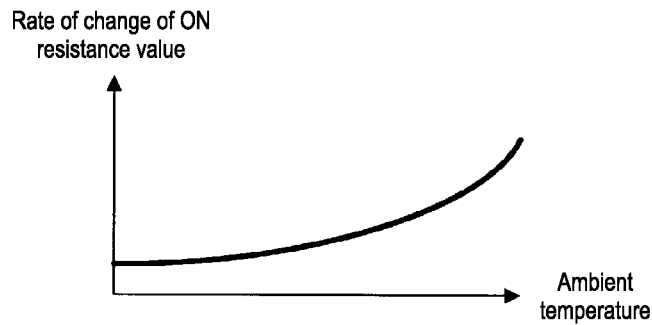
FIG. 6 is a graph showing the relationship between the rate of change of the ON resistance value and the ambient temperature of the semiconductor switch.

FIG. 6 is a graph showing the relationship between the rate of change of the ON resistance value and the ambient temperature of the semiconductor switch. The rate of change of the ON resistance value is the ratio to the reference value indicated by the reference value data. When the ON resistance is X times the reference value, the rate of change of the ON resistance is X. X is a positive real number. As shown in FIG. 6, the higher the ambient temperature of the semiconductor switch 20, the higher the rate of change of the ON resistance value.

Figure 7:
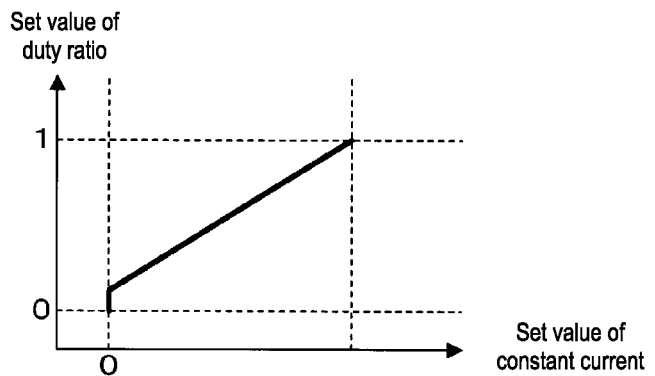
FIG. 7 shows the relationship between the duty ratio and the set value of the switch current.

FIG. 7 shows the relationship between the duty ratio and the set value of the constant current. In the range where the set value of the constant current is above zero, the set value of the duty ratio of the PWM signal is proportional to the set value of the constant current. The greater the set value of the constant current, the greater the duty ratio of the PWM signal. Unless the voltage at the base of the transistor 40, with respect to the ground potential, exceeds a certain value, no current flows through the collector and the emitter of the transistor 40. Therefore, there is a plurality of set values of the duty ratio if the set value of the constant current is 0 A.

A graph showing the relationship between the rate of change of the ON resistance value and the ambient temperature of the semiconductor switch 20 and a graph showing the relationship between the set value of the duty ratio and the constant current are stored in advance in the memory unit 73.

Current Adjustment Process

Figure 8:
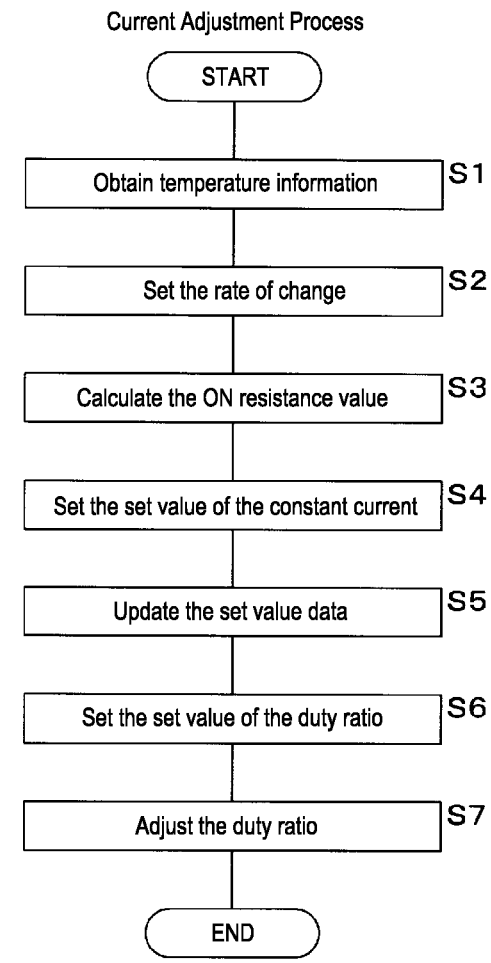
FIG. 8 is a flowchart showing a procedure of the current adjustment process.

FIG. 8 is a flowchart showing a procedure of the current adjustment process. The control unit 74 periodically performs the current adjustment process. In the current adjustment process, the control unit 74 obtains temperature information from the A/D conversion unit 71 (step S1). Next, the control unit 74 sets the rate of change of the ON resistance value of the semiconductor switch 20 to the rate of change corresponding to the rate of change of the ambient temperature of the semiconductor switch 20 indicated by the temperature information obtained in step S1 (step S2). In step S2, the control unit 74 sets the rate of change, for example, to the rate of change corresponding to the ambient temperature indicated by the temperature information obtained in step S1 from the graph showing the relationship between the rate of change of the ON resistance value and the ambient temperature of the semiconductor switch (see FIG. 6).

Note that the method for setting the rate of change is not limited to the method using a graph; for example, it may be a method using a relation expressing the relationship between the rate of change of the ON resistance value and the ambient temperature of the semiconductor switch. In this case, the control unit 74 substitutes the ambient temperature indicated by the temperature information obtained in step S1 for the variable of the ambient temperature in the relational expression and calculates the rate of change. The control unit 74 sets the rate of change of the ON resistance value to the calculated rate of change.

Next, the control unit 74 calculates the ON resistance value of the semiconductor switch 20 by multiplying the rate of change set in step S2 by the reference value indicated by the reference value data (step S3). Next, the control unit 74 sets the set value of the constant current drawn by the constant current circuit 30 to the constant current at which the current threshold is a preset target value (step S4). As described above, the current threshold Ith is expressed by Rc·Ic/Roh. Rc, Ic, and Ron are the value of resistance of the device resistance 21, the constant current, and the ON resistance value, respectively. With the target value of the current threshold Ith denoted as Ig, the constant current Ic at which the current threshold Ith is the target value Ig is expressed as Ron·Ig/Rc.

In step S4, the control unit 74 sets the set value of the constant current to Ron·Ig/Rc. Here, the target value Ig and the value of resistance Rc are constants. The ON resistance value Ron is the ON resistance value calculated in step S3. When the ON resistance value Ron is the reference value, the constant current Ic at which the current threshold Ith is the target value Ig is denoted as the reference current value. Assume that the ON resistance value Ron has increased to X times the reference value according to a change in the ambient temperature of the semiconductor switch 20. In this case, in step S4, the set value of the constant current is set to X times the reference current value. As described above, X is a positive real number.

Since the ON resistance value calculated in step S3 is a value corresponding to the ambient temperature of the semiconductor switch 20 indicated by the temperature information, the set value set in step S4 is also a value corresponding to the ambient temperature of the semiconductor switch 20.

Next, the control unit 74 updates the set value of the constant current indicated by the set value data to the set value set in step S4 (step S5), sets the set value of the duty ratio of the PWM signal to the set value of the duty ratio corresponding to the set value of the constant current indicated by the set value data (step S6). In step S6, the control unit 74, for example, sets the set value of the duty ratio to the set value of the constant current indicated by the set value data in the graph showing the relationship between the set value of the duty ratio and the set value of constant current (see FIG. 7).

Note that the method for setting the duty ratio is not limited to the method using a graph; for example, it may be a method using a relational expressing the relationship between the set value of the duty ratio and the set value of the constant current. In this case, the control unit 74 calculates the set value of the duty ratio by substituting the set value indicated by the set value data for the variable of the set value of the constant current in the relational expression. The control unit 74 sets the set value of the duty ratio to the calculated set value.

Next, the control unit 74 adjusts the duty ratio of the PWM signal being output by the signal output unit 72 to the set value of the duty ratio set in step S6 (step S7). As such, the voltage at the base of the transistor 40 applied by the current adjustment device 31 is adjusted to the set value of the duty ratio set in step S6, i.e., the voltage according to the set value of the constant current set in step S4. As described above, the higher the duty ratio, the higher the voltage at the base.

The constant current is adjusted to a value corresponding to the adjusted voltage at the base. As described above, the higher the voltage at the base, the higher the constant current.

The control unit 74 terminates the current adjustment process after performing step S7. The control unit 74 adjusts the constant current to a value corresponding to the ON resistance value of the semiconductor switch 20 by periodically performing the current adjustment process.

Effects of Current Adjustment Process

Figure 9:
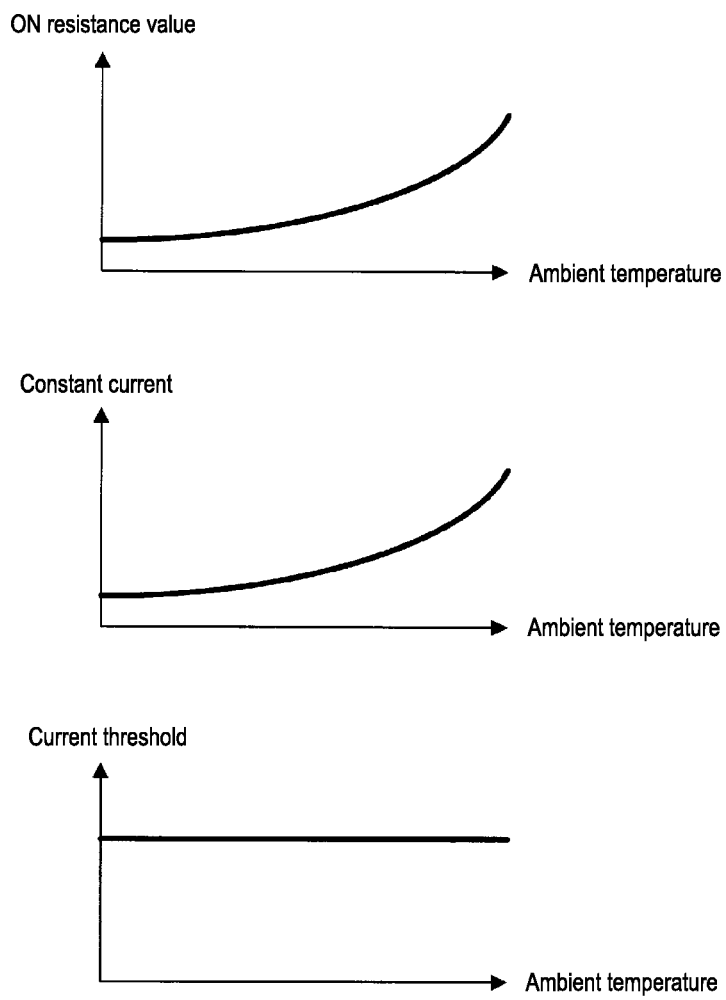
FIG. 9 is an explanatory view of the effects of the current adjustment process.

FIG. 9 is an explanatory view of the effects of the current adjustment process. FIG. 9 shows a graph showing the relationship between the ON resistance value and an ambient temperature, a graph showing the relationship between the constant current and the ambient temperature, and a graph showing the relationship between the current threshold and the ambient temperature. Here, the ambient temperature is the ambient temperature of the semiconductor switch 20.

The temperature of the semiconductor switch 20, i.e., the ambient temperature of the semiconductor switch 20, changes for various reasons. As shown in FIG. 9, when the ambient temperature of the semiconductor switch 20 changes, the ON resistance value of the semiconductor switch 20 also changes. The control unit 74 periodically performs the current adjustment process. In this way, the constant current changes according to the ambient temperature of the semiconductor switch 20 in the same manner as the ON resistance value.

Specifically, if the ON resistance value is X times the reference value due to the change in the ambient temperature, the constant current is adjusted to X times the reference current value through the current adjustment process. As described above, X is a positive real number, and the reference current value is the constant current at which the current threshold is the target value when the ON resistance value is the reference value. Since the constant current is adjusted as described above, the current threshold is maintained at a constant target value regardless of the ambient temperature of the semiconductor switch 20, as shown in FIG. 9.

Fine Adjustment Process

Figure 10:
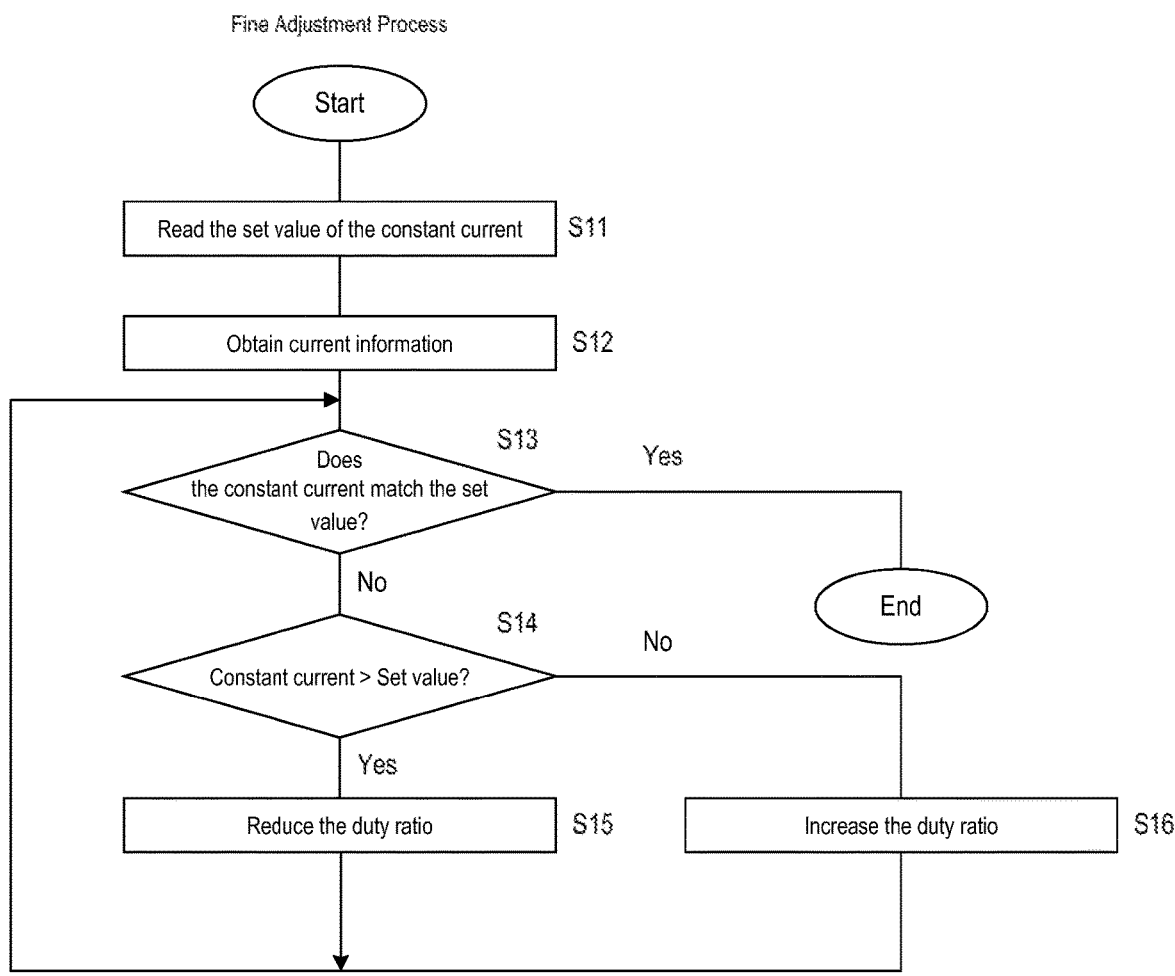
FIG. 10 is a flowchart showing a procedure of the fine adjustment process.

FIG. 10 is a flowchart showing a procedure of the fine adjustment process. In the current adjustment process, the duty ratio of the PWM signal, i.e., the voltage at the base of the transistor 40, is adjusted so that the constant current becomes the set value. However, it is possible that the current adjustment process does not adjust the actual constant current to the set value. The fine adjustment process is a process to adjust the actual constant current to the set value. The control unit 74 periodically performs the fine adjustment process.

In the fine adjustment process, the control unit 74 reads the set value of the constant current indicated by the set value data (step S11) and obtains current information from the A/D conversion unit 71 (step S12). As described above, the current information is the voltage between the two ends of the circuit resistor 41 and indicates the actual constant current. Next, the control unit 74 checks if the actual constant current indicated by the current information obtained in step S12 matches the set value read in step S11 (step S13). Here, "match" as used in step S13 is not limited to its strict meaning. For example, if the difference value between the actual constant current and the set value is less than a predetermined value, the control unit 74 may determine in step S13 that the actual current value matches the set value. In this case, if the difference value between the actual current and the set value is greater than or equal to the predetermined value, the control unit 74 determines in step S13 that the actual current value is different from the set value. The predetermined value is set in advance; for example, it is a value that can be regarded as an error.

If it is determined that the actual constant current matches the set value (YES in step S13), the control unit 74 terminates the fine adjustment process. If it is determined that the actual constant current does not match the set value, i.e., the actual constant current is different from the set value (NO in step S13), the control unit 74 determines that the actual constant current indicated by the current information obtained in step S12 exceeds the set value read in step S11 (step S14). If it is determined that the actual constant current exceeds the set value (YES in S14), the control unit 74 reduces the duty ratio of the PWM signal being output by the signal output unit 72 (Step S15). As such, the voltage at the base of the transistor 40 is reduced, and the constant current is reduced. As a first example, the amount of reduction of the duty ratio may be a constant value. As a second example, the amount of reduction of the duty ratio may be an amount corresponding to the difference value between the constant current and the set value. In this case, the larger the difference value, the larger the amount of reduction.

If it is determined that the actual constant current does not exceed the set value (NO in S14), the actual constant current is less than the set value, so that the control unit 74 increases the duty ratio of the PWM signal output by the signal output unit 72 (step S16). As such, the voltage at the base of the transistor 40 increases and the constant current increases. As a first example, the amount of increase of the duty ratio may be a constant value. As a second example, the amount of increase of the duty ratio may be an amount corresponding to the difference value between the constant current and the set value. In this case, the larger the difference value, the larger the amount of increase.

If it is determined in step S13 that the actual constant current matches the set value, the control unit 74 terminates the fine adjustment process, and if it is determined that the actual constant current does not match the set value, the control unit 74 adjusts the voltage at the base of the transistor 40 included in the constant current circuit 30. Therefore, performing step S13 means determining whether or not to adjust the voltage at the base of the transistor 40 based on the difference value between the constant current indicated by the current information obtained in step S12 and the set value indicated by the set value data.

After performing step S15 or step S16, the control unit 74 performs step S13 again. If the actual constant current is different from the set value, the control unit 74 repeatedly adjusts the duty ratio of the PWM signal being output by the signal output unit 72, i.e., the voltage at the base of the transistor 40 until the actual constant current matches the set value. In this way, the control unit 74 can adjust the actual constant current drawn by the constant current circuit 30 to the set value indicated by the set value data, i.e., the set value set in step S4 of the current adjustment process. Here, "match" regarding the constant current circuit and the set value is not limited to its strict meaning.

Further Notes

The current information is not limited to the voltage between the two ends of the circuit resistor 41; for example, it may be the voltage between the two ends of the device resistor 21. In this case, the constant current can be calculated by dividing the voltage between the two ends of the device resistor 21 by the value of resistance of the device resistor 21. Furthermore, a resistor may be placed upstream of the transistor 40 in the current path of the constant current. In this case, the current information may be the voltage between the two ends of this resistor.

The adjustment of the duty ratio of the PWM signal is equivalent to the adjustment of the voltage at the base of the transistor 40. Therefore, the microcomputer 50 may directly adjust the voltage at the base of the transistor 40, rather than the duty ratio of the PWM signal. The higher the duty ratio of the PWM signal, the higher the voltage at the base of the transistor 40, so that the control unit 74 sets the set value of the voltage at the base in the same manner as the set value of the duty ratio. In the configuration in which the voltage at the base of the transistor 40 is adjusted directly, the microcomputer 50 includes, instead of the signal output unit, a voltage application unit that applies a voltage directly to the base of the transistor 40. The voltage application unit is connected to the base of the transistor 40 and adjusts the voltage at the base according to the instructions of the microcomputer 50.

Embodiment 2

The constant current circuit 30 of Embodiment 1 is implemented by the transistor 40 and the circuit resistor 41. However, the configuration of the constant current circuit that draws a constant current is not limited to the configuration of the constant current circuit 30.

The following describes the specifics of Embodiment 2 that differ from Embodiment 1. It is identical to Embodiment 1 other than the configurations described below. As such, identical reference symbols used in Embodiment 1 are assigned to components identical to those of Embodiment 1, and their description is omitted.

Configuration of Current Control Device

Figure 11:
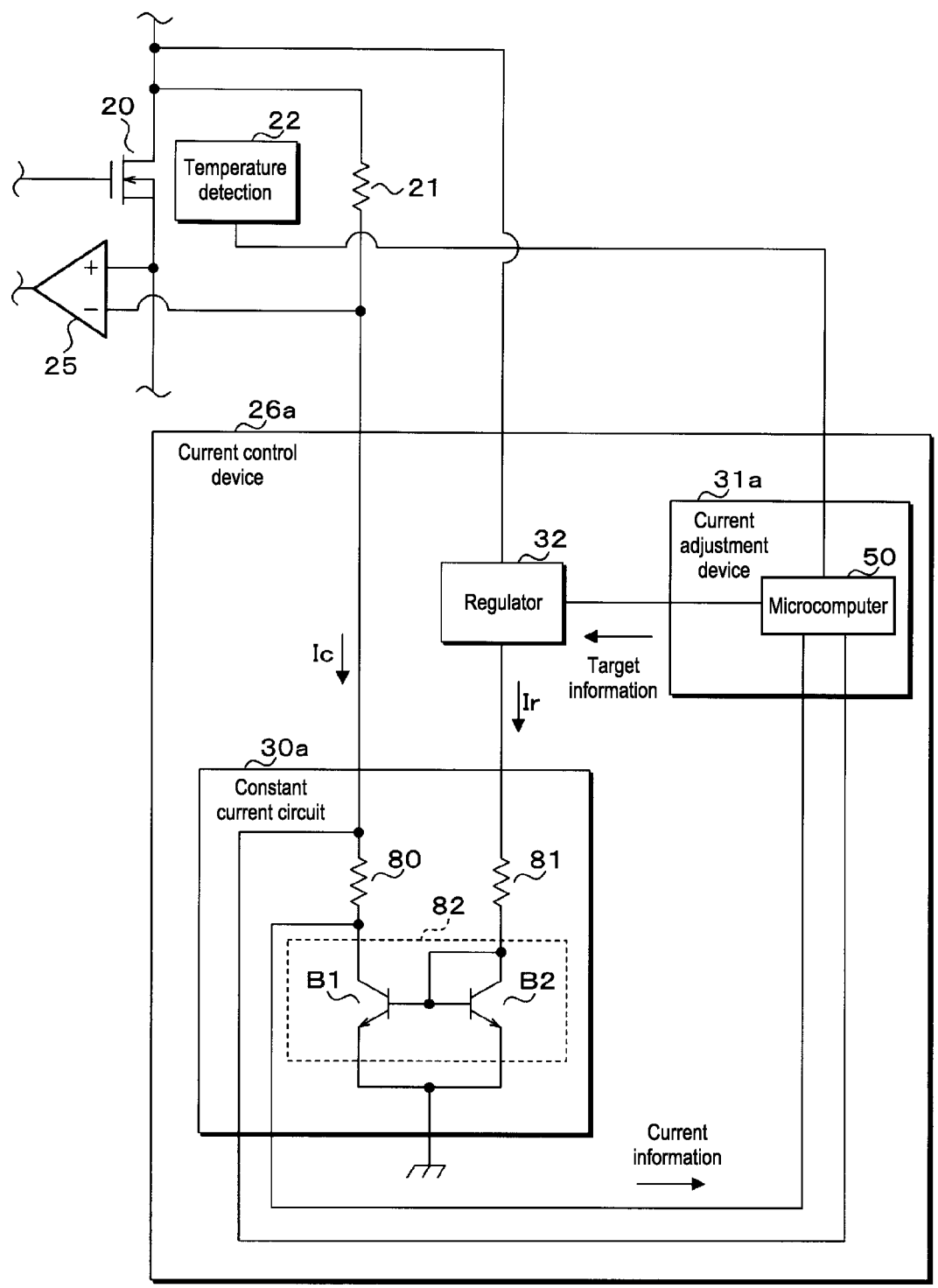
FIG. 11 is a block diagram illustrating the configuration of the main parts of a power supply system in an Embodiment 2.

FIG. 11 is a block diagram illustrating the configuration of the main parts of a current control device 26a in Embodiment 2. The switch control device 10 of Embodiment 2 includes all the components included in the switch control device 10 of Embodiment 1 other than the current control device 26. The switch control device 10 of Embodiment 2 includes the current control device 26a instead of the current control device 26. The current control device 26a includes a constant current circuit 30a, a current adjustment device 31a, and a regulator 32. The current adjustment device 31a includes a microcomputer 50.

The other end of the device resistor 21 is connected to the constant current circuit 30a. The constant current circuit 30a is grounded. The drain of the semiconductor switch 20 is connected to the regulator 32. The regulator 32 is connected to the constant current circuit 30 and the microcomputer 50 of the current adjustment device 31a. The temperature detection unit 22 is connected to the microcomputer 50 of the current adjustment device 31a. The microcomputer 50 is further connected to the constant current circuit 30.

The constant current circuit 30a of the current adjustment device 31a draws a constant current from the positive pole of the battery 11 through the device resistor 21 in the same manner as the constant current circuit 30 of Embodiment 1.

The regulator 32 reduces the output voltage of the battery 11, with respect to the ground potential, to a target voltage, and applies the target voltage to the constant current circuit 30a. As such, current flows from the regulator 32 to the constant current circuit 30a. The target voltage is a voltage with respect to the ground potential. The current flowing from the regulator 32 to the constant current circuit 30a is referred to as the "reference current". The reference current is denoted as Ir.

The constant current Ic drawn by the constant current circuit 30a substantially corresponds to K times the reference current Ir. K is a positive real number. The reference current Ir changes with the target voltage. Therefore, the constant current Ic is adjusted by adjusting the target voltage.

The microcomputer 50 obtains temperature information from the temperature detection unit 22 as in Embodiment 1. The microcomputer 50 further obtains current information indicating the constant current Ic from the constant current circuit 30a. The microcomputer 50 adjusts the voltage applied by the regulator 32 to the constant current circuit 30a based on the obtained temperature and current information.

As described above, the constant current circuit 30a and the current adjustment device 31a function in the same manner as the constant current circuit 30 and the current adjustment device 31a of Embodiment 1, respectively.

Configuration of Constant Current Circuit 30a

The constant current circuit 30a includes a first circuit resistor 80, a second circuit resistor 81, and a current mirror circuit 82. The current mirror circuit 82 includes a first transistor B1 and a second transistor B2. The first transistor B1 and the second transistor B2 are each an NPN bipolar transistor.

One end of the first circuit resistor 80 is connected to the other end of the device resistor 21. The other end of first circuit resistor 80 is connected to the collector of the first transistor B1. One end of the second circuit resistor 81 is connected to the regulator 32. The other end of the second circuit resistor 81 is connected to the collector and the base of the second transistor B2. The base of the first transistor B1 is connected to the base of the second transistor B2. The emitters of the first transistor B1 and the second transistor B2 are grounded. Both ends of the first circuit resistor 80 are connected to the microcomputer 50.

The constant current Ic flows from the positive pole of the battery 11 to the device resistor 21, to the first circuit resistor 80, and to the first transistor B1, in that order. In the first transistor B1, the constant current Ic flows to the collector and to the base, in that order. The reference current Ir flows from the regulator 32 to the second circuit resistor 81 and to the second transistor B2, in that order. In the second transistor B2, most of the reference current Ir flows to the collector and to the base, in that order. In the second transistor B2, the current flowing through the collector and the base substantially matches the reference current Ir.

As described above, the emitter and the base of the first transistor B1 are connected to the emitter and the base of the second transistor B2, respectively. Therefore, the voltage between the base and the emitter of the first transistor B1 matches the voltage between the base and the emitter of the second transistor B2. In an NPN bipolar transistor, the collector current flowing through the collector and the emitter in that order is determined by the voltage between the emitter and the base. Therefore, the constant current Ic is adjusted to K times the reference current Ir.

The relationship between the collector current and the voltage between the emitter and the base is referred to as the "transistor characteristics". If the transistor characteristics of the first transistor B1 and the second transistor B2 are the same, the constant current Ic substantially matches the reference current Ir. The larger the target voltage applied by the regulator 32 to one end of the second circuit resistor 81 of the constant current circuit 30a, the larger the reference current Ir.

The microcomputer 50 outputs target information indicating the set value of the target voltage to the regulator 32. The regulator 32 adjusts the target voltage applied to one end of the second circuit resistor 81 of the constant current circuit 30a to the set value. The microcomputer 50 adjusts the target voltage by outputting target information indicating various set values to the regulator 32.

The voltage between the two ends of the first circuit resistor 80 is expressed as (value of resistance of the first circuit resistor 80) Ic. Since the value of resistance of the first circuit resistor 80 is a constant value, the constant current Ic can be calculated by dividing the voltage between the two ends of the first circuit resistor 80 by the value of resistance of the first circuit resistor 80. The voltage between the two ends of the first circuit resistor 80 is output to the microcomputer 50 as current information indicating the constant current Ic.

The microcomputer 50 adjusts the target voltage applied by the regulator 32 based on the temperature information input from the temperature detection unit 22 and the current input from the constant current circuit 30a.

Configuration of Microcomputer 50

Figure 12:
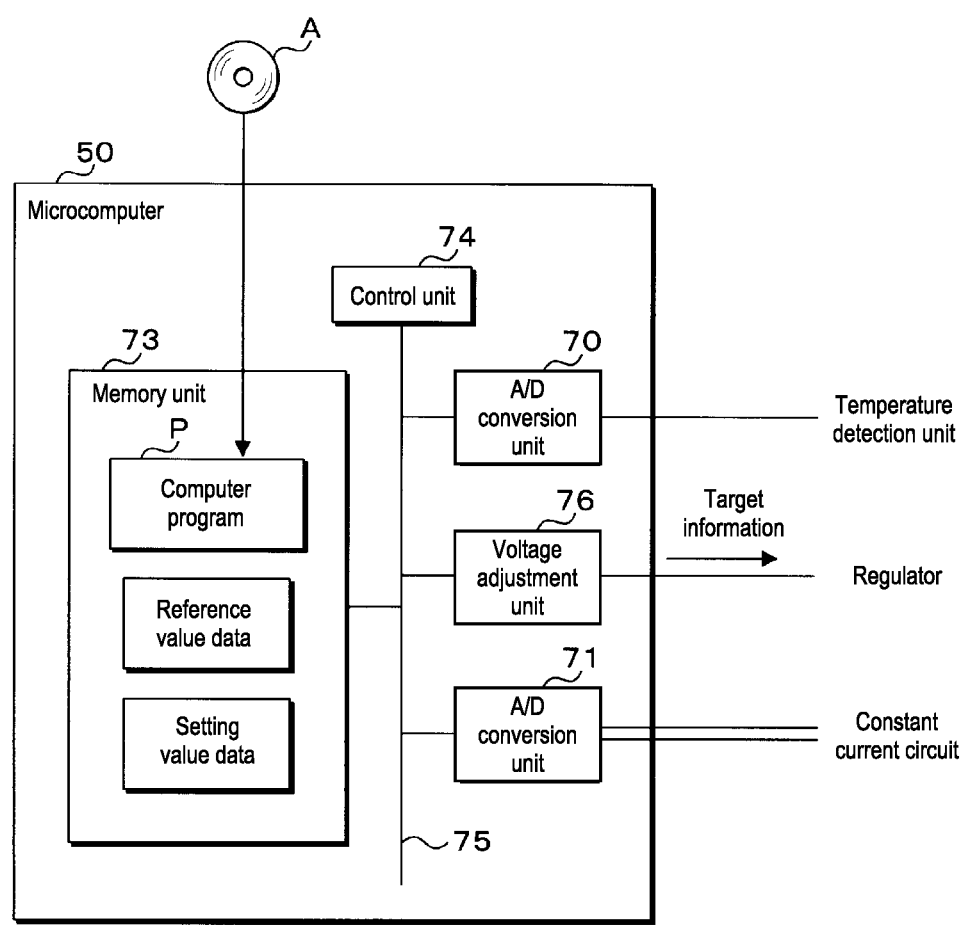
FIG. 12 is a block diagram showing the configuration of the main parts of a micon.

FIG. 12 is a block diagram showing the configuration of a main unit of the microcomputer 50. The microcomputer 50 of Embodiment 2 includes all the components of the microcomputer 50 of Embodiment 1 other than the signal output unit 72. The microcomputer 50 of Embodiment 2 includes a voltage adjustment unit 76 instead of the signal output unit 72. The voltage adjustment unit 76 is 20 separately connected to the internal bus 75 and the regulator 32.

The A/D conversion unit 71 functions in the same manner as in Embodiment 1. However, the current information input to the A/D conversion unit 71 is not about the voltage between the two ends of the circuit resistor 41, but about the voltage between the two ends of the first circuit resistor.

The voltage adjustment unit 76 adjusts the target voltage that the regulator 32 applies to one end of the second circuit resistor 81 of the constant current circuit 30a by outputting target information that indicates various set values. The voltage adjustment unit 76 adjusts the target voltage according to the instructions of the control unit 74.

Current Adjustment Process

The control 74 performs a current adjustment process similar to the current adjustment process of Embodiment 1 shown in FIG. 8. In step S6 of Embodiment 2, the control unit 74 sets, rather than the duty ratio of the PWM signal, the set value of the target voltage to the set value of the target voltage corresponding to the set value of the constant current indicated by the set value data. In step S6, as in Embodiment 1, the control unit 74 may set the set value of the target voltage using a graph showing the relationship between the set value of the target voltage and the set value of the constant current. Furthermore, in step S6, the control unit 74 may set the set value of the target voltage using a relational expression showing the relationship between the set value of the target voltage and the set value of the constant current. In step S6, the larger the set value of the constant current, the larger the set value of the target voltage.

In step S7 of Embodiment 2, the control unit 74 instructs the voltage adjustment unit 76 to adjust the target voltage to the set value set in step S6. After performing step S7, the control unit 74 terminates the current adjustment process.

Fine Adjustment Process

The control unit 74 performs a fine adjustment process similar to the fine adjustment process of Embodiment 1 shown in FIG. 10. In step S15 of Embodiment 2, the control unit 74 instructs the voltage adjustment unit 76 to reduce the target voltage rather than the duty ratio of the PWM signal. As a first example, the amount of reduction of the target voltage may be a constant value. As a second example, the amount of reduction of the target voltage may be an amount corresponding to the difference value between the actual constant current and the set value of the constant current. In this case, the larger the difference value, the larger the amount of reduction.

In step S16 of Embodiment 2, the control unit 74 instructs the voltage adjustment unit 76 to increase the target voltage rather than the duty ratio of the PWM signal. As a first example, the amount of increase of the target voltage may be a constant value. As a second example, the amount of increase of the target voltage may be an amount corresponding to the difference value between the actual constant current and the set value of the constant current. In this case, the larger the difference value, the larger the amount of increase.

As in Embodiment 1, after performing step S15 or step S16, the control unit 74 performs step S13 again. If the actual constant current is different from the set value, the control unit 74 repeatedly adjusts the target voltage applied by the regulator 32 until the actual constant current matches the set value. In this way, the control unit 74 can adjust the actual constant current drawn by the constant current circuit 30 to the set value indicated by the set value data, i.e., the set value set in step S4 of the current adjustment process.

Effects of Switch Control Device 10

The switch control device 10 of Embodiment 2 provides the same effects as the switch control device 10 of Embodiment 1. Therefore, an overcurrent that greatly exceeds the current threshold is prevented from flowing through the semiconductor switch 20, and the current threshold is maintained at a constant value that is independent of the ambient temperature of the semiconductor switch Notes on Embodiment 2

In Embodiment 2, the method for adjusting the constant current Ic is not limited to a method for adjusting the target voltage. The target voltage may be fixed. In this case, for example, a variable resistor is connected in place of the first circuit resistor 80. The constant current Ic can be adjusted by adjusting the value of resistance of the variable resistor. In this configuration, the microcomputer 50 adjusts the value of resistance of the variable resistor instead of adjusting the target voltage. The smaller the value of resistance of the variable resistor, the larger the constant current Ic. Therefore, the value of resistance of the variable resistor is increased instead of reducing the target voltage. The value of resistance of the variable resistor is reduced instead of increasing the target voltage.

In Embodiment 2, each of the first transistor B1 and the second transistor B2 is not limited to an NPN bipolar transistor, but may be an N-channel FET, for example.

Variants of Embodiments 1 and 2

A device in which the current control device 26 of Embodiment 1 or the current control device 26a of Embodiment 2 is used are not limited to the switch control device 10. The current control devices 26 and 26a each can be used in a device that supplies a constant current to a load.

In Embodiments 1 and 2, the semiconductor switch 20 is not limited to an N-channel MOSFET, and may be any semiconductor switch whose ON resistance value changes according to the ambient temperature. For example, the semiconductor switch 20 may be a semiconductor switch whose ON resistance value is reduced when the ambient temperature decreases.

The disclosed Embodiments 1 and 2 should be considered to be illustrative in all respects and not restrictive. The scope of the present disclosure is indicated by the claims rather than the above meaning, and all changes that come within of the claims and the meaning and range of equivalency of the claims are intended to be encompassed within the scope of the disclosure.

The invention claimed is:

1. A current control device for controlling current from a battery, comprising:
   a constant current circuit to which a voltage from the battery is being applied, the constant current circuit drawing a constant current from a positive pole of the battery that depends on the voltage that is applied and returns the constant current to a negative pole of the battery, and
   a processing unit for performing processing,
   wherein the processing unit is configured to:
      set a value of the constant current drawn by the constant current circuit,
      adjust the voltage being applied to the constant current circuit to a voltage according to the set value that is set,
      obtain current information indicating the constant current drawn by the constant current circuit, and
      determine whether or not to adjust the voltage being applied to the constant current circuit based on a difference value between the constant current indicated by the obtained current information and the set value that is set.

2. The current control device of claim 1, wherein the constant current circuit comprises:
   an NPN bipolar transistor whose collector is located upstream of its emitter in a current path of the constant current, and
   a resistor located downstream of the bipolar transistor in the current path,
   wherein the processing unit is configured to adjust a voltage of a base of the bipolar transistor of the constant current circuit to the voltage according to the set value that is set.

3. The current control device of claim 2, wherein the current information is a voltage between two ends of the resistor.

4. The current control device of claim 2 comprising:
   a signal output unit for outputting a PWM signal, and
   a smoothing circuit for smoothing a voltage of the PWM signal output by the signal output unit,
   wherein the voltage smoothed by the smoothing circuit is applied to the base of the bipolar transistor, and
   wherein the processing unit is configured to adjust a duty ratio of the PWM signal according to the set value that is set.

5. A switch control device comprising:
   a semiconductor switch through which a current flows,
   a second resistor connected to an upstream end of the semiconductor switch,
   a switch unit for switching OFF the semiconductor switch when a switch voltage at a downstream end of the semiconductor switch is less than a resistor voltage of a downstream end of the second resistor,
   a constant current circuit to which a voltage is being applied, the constant current circuit drawing, through the second resistor, a constant current according to the voltage being applied, and
   a processing unit for performing processing,
   wherein the processing unit is configured to:
   set a value of the constant current drawn by the constant current circuit,
   adjust the voltage being applied to the constant current circuit to a voltage according to the set value that is set,
   obtain current information indicating the constant current drawn by the constant current circuit, and
   determine whether or not to adjust the voltage being applied to the constant current circuit based on a difference value between the constant current indicated by the obtained current information and the set value that is set.

6. The switch control device of claim 5 comprising a temperature detection unit for detecting an ambient temperature of the semiconductor switch,
   wherein the processing unit is configured to set the set value of the constant current drawn by the constant current circuit according to the ambient temperature detected by the temperature detection unit.

7. A current control method in which a computer performs the steps of:
   applying a constant current from a positive pole of a battery to a constant current circuit;
   setting a value of the constant current, the constant current circuit drawing the constant current according to the applied voltage,
   adjusting the voltage applied to the constant current circuit to a voltage according to the set value that is set,
   obtaining current information indicating the constant current drawn by the constant current circuit, and
   determining whether or not to adjust the voltage applied to the constant current circuit based on a difference value between the constant current indicated by the obtained current information and the set value that is set, and returning the constant current to a negative pole of the battery.

8. The current control device of claim 3 comprising:
   a signal output unit for outputting a PWM signal, and
   a smoothing circuit for smoothing a voltage of the PWM signal output by the signal output unit,
   wherein the voltage smoothed by the smoothing circuit is applied to the base of the bipolar transistor, and
   wherein the processing unit is configured to adjust a duty ratio of the PWM signal according to the set value that is set.

* * * * *